United States Patent [19]
Ito et al.

[11] Patent Number: 5,744,998
[45] Date of Patent: Apr. 28, 1998

[54] INTERNAL VOLTAGE DETECTING CIRCUIT HAVING SUPERIOR RESPONSIBILITY

[75] Inventors: Takashi Ito; Tadaaki Yamauchi; Takaharu Tsuji, all of Hyogo, Japan

[73] Assignee: Mitsubishi Denki Kabushiki Kaisha, Tokyo, Japan

[21] Appl. No.: 760,010

[22] Filed: Dec. 3, 1996

[30] Foreign Application Priority Data

Jun. 7, 1996 [JP] Japan ................................ 8-145715

[51] Int. Cl.$^6$ ................................................ H03K 3/01
[52] U.S. Cl. ................................ 327/537; 327/534
[58] Field of Search ............................ 327/534–537, 327/77, 80, 81, 87–89

[56] References Cited

U.S. PATENT DOCUMENTS 5,227,675  7/1993  Taguchi ..................................... 327/537
5,347,172  9/1994  Cordoba et al. ......................... 327/536

FOREIGN PATENT DOCUMENTS 57-121269  7/1982  Japan.

*Primary Examiner*—Timothy P. Callahan
*Assistant Examiner*—T. T. Lam
*Attorney, Agent, or Firm*—McDermott, Will & Emery

[57] ABSTRACT

A substrate voltage detecting circuit includes a detection node, a transistor responsive to a detected substrate voltage for changing a comparison voltage, a differential amplifier for comparing the comparison voltage with a prescribed reference voltage and outputting an enable signal when the comparison voltage exceeds the reference voltage, and a transistor turned on in response to the enable signal for fixing the reference voltage at an L level. The internal voltage detecting circuit further includes transistors for reducing current consumption. Consequently, the responsibility thereof is improved even with small power consumption.

6 Claims, 7 Drawing Sheets

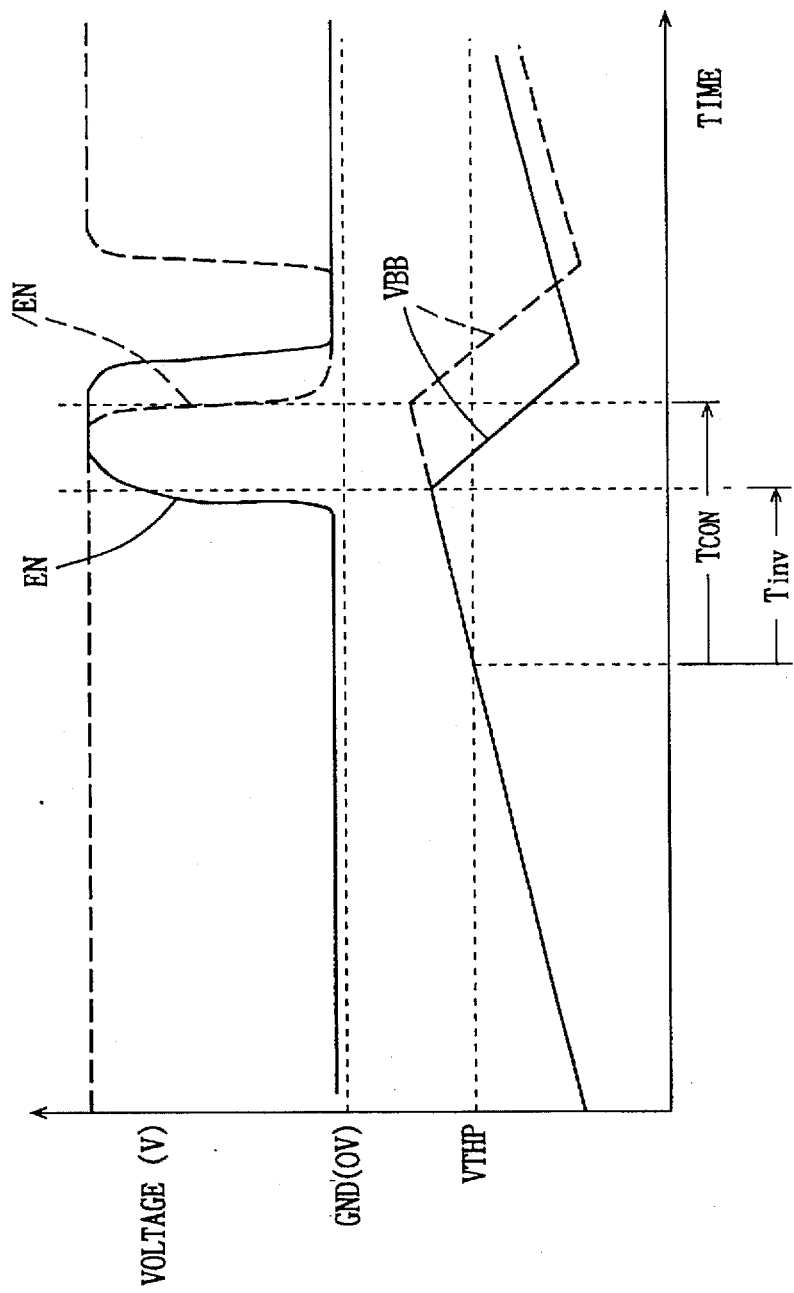

INTERNAL VOLTAGE DETECTING CIRCUIT HAVING SUPERIOR RESPONSIBILITY

BACKGROUND OF THE INVENTION

1. Field of the Invention

The present invention relates to an internal voltage detecting circuit, and more particularly, to a substrate voltage detecting circuit for detecting a substrate voltage in a semiconductor memory device such as a DRAM (Dynamic Random Access Memory) and activating a substrate voltage generation circuit when the detected substrate voltage does not attain a prescribed level.

2. Description of the Background Art

A charge pumping circuit 11 for generating a negative substrate voltage VBB to be supplied to a semiconductor substrate (not shown) as shown in FIG. 9 is used in a semiconductor memory device such as a DRAM. In the conventional example, a substrate voltage detecting circuit as shown in FIG. 9 is connected to charge pumping circuit 11 in order to retain the substrate voltage VBB at a prescribed level.

Referring to FIG. 9, the conventional substrate voltage detecting circuit includes a detection node 3, a diode-connected p channel MOS transistor 5, p channel MOS transistors 6 and 7 constituting a current mirror circuit, a resistance element 8, a p channel MOS transistor 9, and an inverter 10.

Resistance element 8 and p channel MOS transistor 7 constitute a constant voltage source which generates a constant reference voltage Vref0. Therefore, p channel MOS transistor 6 receiving the reference voltage Vref0 functions as a constant current source.

The operation of such a conventional substrate voltage detecting circuit will now be described with reference to FIG. 2.

First, when a substrate voltage VBB is lower than a threshold voltage VTHP (negative) of p channel MOS transistor 5, inverter 10 supplies an enable signal /EN (a signal with the sign "/" represents an active low signal) at an H (logic high) level to charge pumping circuit 11. Since charge pumping circuit 11 is activated in response to the enable signal /EN at an L (logic low) level, charge pumping circuit 11 will not operate at this time. Furthermore, p channel MOS transistor 9 is turned off. In other words, when the substrate voltage VBB attains a prescribed level, charge pumping circuit 11 will not generate the substrate voltage VBB.

On the other hand, when the substrate voltage VBB increases to be higher than the threshold voltage VTHP of p channel MOS transistor 5, p channel MOS transistor 5 is turned off, so that a voltage at a node 4 increases. Therefore, inverter 10 supplies an enable signal /EN at an L level as shown by a dotted line in FIG. 2. Accordingly, charge pumping circuit 11 starts its operation, whereby the substrate voltage VBB decreases as shown by a dotted line in FIG. 2. Furthermore, since a gate voltage of p channel MOS transistor 9 falls to an L level, p channel MOS transistor 9 is turned on. Therefore, the voltage at node 4 is fixed at an H level. In other words, when the substrate voltage VBB does not attain the prescribed level, charge pumping circuit 11 will generate a substrate voltage VBB.

When the substrate voltage VBB is made sufficiently lower than the threshold voltage VTHP by charge pumping circuit 11, the voltage at node 4 decreases again. Therefore, inverter 10 again supplies an enable signal /EN at an H level.

Accordingly, charge pumping circuit 11 stops its operation, and p channel MOS transistor 9 is turned off. In the following operation, the above described operation is repeated with increase in the substrate voltage VBB.

However, as shown in FIG. 2, response time Tcon from the time when the substrate voltage VBB attains a level higher than the prescribed level until the enable signal /EN falls to an L level is long in such a structure as described above, and therefore, charge pumping circuit 11 cannot supply a stable substrate voltage VBB.

SUMMARY OF THE INVENTION

It is an object of the present invention to provide an internal voltage detecting circuit having superior responsibility.

It is another object of the present invention to provide an internal voltage detecting circuit capable of further stabilizing an internal voltage.

An internal voltage detecting circuit according to the present invention detects an internal voltage and activates, when the detected internal voltage does not attain a prescribed level, an internal voltage generation circuit for generating an internal voltage, and includes a detection node, a reference node, a comparison node, a change circuit, a comparison circuit and an enlargement circuit. The detection node receives the internal voltage. A prescribed reference voltage is generated at the reference node. A comparison voltage is generated at the comparison node. The change circuit changes the comparison voltage in response to the internal voltage. The comparison circuit compares the comparison voltage with the reference voltage, and outputs, when the comparison voltage is higher than the reference voltage, an activation signal for activating the internal voltage generation circuit. The enlargement circuit enlarges the difference between the comparison voltage and the reference voltage in response to the activation signal.

According to the above mentioned internal voltage detecting circuit, since the comparison circuit for comparing the comparison voltage with the reference voltage is provided, the activation signal is output immediately when the detected internal voltage does not attain the prescribed level. As a result, the responsibility of the internal voltage detecting circuit is improved. In addition, since the enlargement circuit responsive to the activation signal for enlarging the difference between the comparison voltage and the reference voltage is provided, the activation signal is not immediately activated when the detected internal voltage attains the prescribed level. Consequently, the internal voltage will not vary frequently around the prescribed level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a timing chart illustrating the operation of the substrate voltage detecting circuit of FIG. 1A.

DESCRIPTION OF THE PREFERRED EMBODIMENTS

Figure 1A:
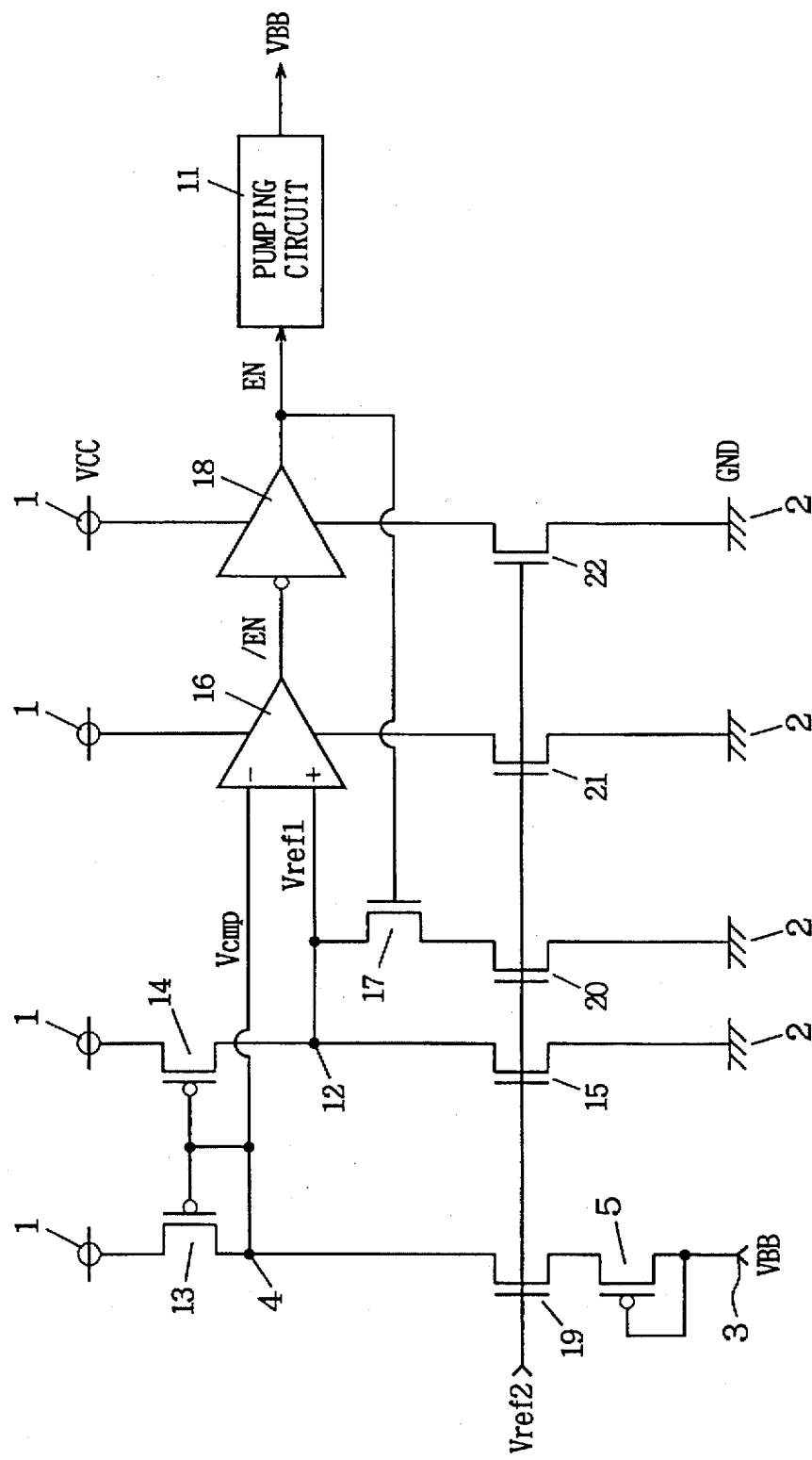
FIG. 1A is a circuit diagram showing a structure of a substrate voltage detecting circuit according to a first embodiment of the present invention.

Embodiments of the present invention will now be described in detail in conjunction with the accompanying drawings. Note that the same or corresponding portions are denoted by the same reference numerals and characters.

[First Embodiment]

Referring to FIG. 1A, a substrate voltage detecting circuit according to a first embodiment of the present invention detects a substrate voltage VBB, and activates, when the detected substrate voltage VBB does not attain a prescribed level, a charge pumping circuit 11 for generating a substrate voltage VBB. The substrate voltage detecting circuit includes a detection node 3 receiving the substrate voltage VBB, a reference node 12 where a prescribed reference voltage Vref1 is generated, a comparison node 4 where a comparison voltage Vcmp is generated, a diode-connected p channel MOS transistor 5 connected between detection node 3 and comparison node 4, a diode-connected p channel MOS transistor 13 connected between comparison node 4 and a power supply node 1, a p channel MOS transistor 14 connected between reference node 12 and power supply node 1 and having its gate connected to the gate of p channel MOS transistor 13, an n channel MOS transistor 15 connected to reference node 12 for supplying prescribed current to p channel MOS transistor 14, a differential amplifier 16 having an input node (−) connected to comparison node 4 and an input node (+) connected to reference node 12 outputting an enable signal /EN for activating charge pumping circuit 11 when the comparison voltage Vcmp is higher than the reference voltage Vref1, and an n channel MOS transistor 17 connected between reference node 12 and a ground node 2 and turned on in response to an enable signal EN.

The substrate voltage detecting circuit further includes an inverter 18 responsive to the enable signal /EN for outputting an enable signal EN for activating charge pumping circuit 11, an n channel MOS transistor 19 connected between p channel MOS transistors 13 and 5, an n channel MOS transistor 20 connected between n channel MOS transistor 17 and ground node 2, an n channel MOS transistor 21 connected between differential amplifier 16 and ground node 2, and an n channel MOS transistor 22 connected between inverter 18 and ground node 2.

The n channel MOS transistors 15, 19 to 22 receive a constant reference voltage Vref2 in common at their gates. Differential amplifier 16 has a relatively high gain. The p channel MOS transistors 13 and 14 constitute a current mirror circuit. MOS transistors 14 and 15 constitute a constant voltage source which generates the constant reference voltage Vref1. The enable signal EN from inverter 18 is fed back to the gate of n channel MOS transistor 17. Each of n channel MOS transistors 15, 19 to 22 functions as a constant current source.

Figure 1B:
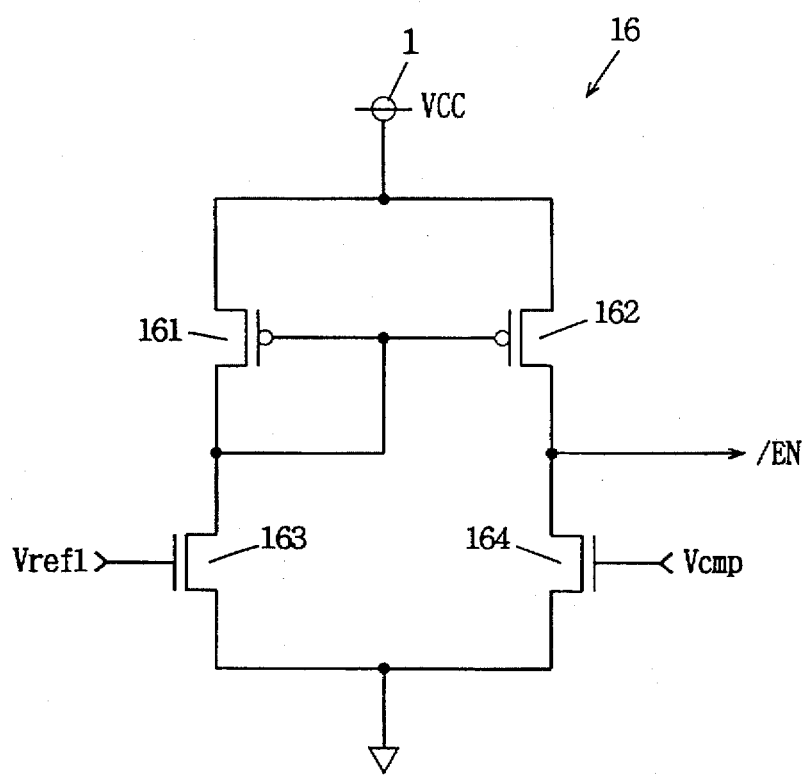
FIG. 1B is a circuit diagram showing a structure of a differential amplifier in FIG. 1A.

Referring to FIG. 1B, the differential amplifier 16 includes p channel MOS transistors 161, 162 and n channel MOS transistors 163, 164. The transistor 161 has its source connected to the power supply node 1, its drain and gate connected to each other. The transistor 162 has its source connected to the power supply node 1, its drain outputting the activation signal /EN and its gate connected to the gate of the transistor 161. The transistor 163 has its source connected to the ground node 2 via the transistor 21, its drain connected to the drain of the transistor 161 and its gate receiving the reference voltage Vref1. The transistor 164 has its source connected to the ground node 2 via the transistor 21, its drain connected to the drain of the transistor 162 and its gate receiving the comparison voltage Vcmp.

The operation of the substrate voltage detecting circuit structured as such will now be described with reference to FIG. 2.

First, when a substrate voltage VBB detected at detection node 3 is lower than a threshold voltage VTHP (negative) of p channel MOS transistor 5, p channel MOS transistor 5 is turned on. Therefore, p channel MOS transistor 5 reduces a comparison voltage Vcmp in response to the substrate voltage VBB. When the comparison voltage Vcmp is lower than a reference voltage Vref1, differential amplifier 16 outputs an enable signal /EN at an H level. Inverter 18 outputs an enable signal EN at an level in response to the enable signal at an H level. Accordingly, charge pumping circuit 11 is deactivated and n channel MOS transistor 17 is turned off. In other words, when the substrate voltage VBB attains a prescribed level, charge pumping circuit 11 will not generate a substrate voltage VBB.

When charge pumping circuit 11 does not operate as such, the substrate voltage VBB gradually increases as shown by a solid line in FIG. 2. When the substrate voltage VBB becomes higher than the threshold voltage VTHP, p channel MOS transistor 5 is turned off. Therefore, the comparison voltage Vcmp at comparison node 4 increases. On the other hand, since a gate voltage (Vcmp) of p channel MOS transistor 14 increases, the reference voltage Vref1 at reference node 12 decreases.

As a result, when the comparison voltage Vcmp exceeds the reference voltage Vref1, that is, when the comparison voltage Vcmp becomes higher than the reference voltage Vref1, differential amplifier 16 outputs an enable signal /EN at an L level. Inverter 18 outputs an enable signal EN at an H level in response to the enable signal /EN at an L level.

Since the enable signal EN at an H level is fed back to the gate of n channel MOS transistor 17, transistor 17 is turned on. Therefore, the reference voltage Vref1 is pulled down to a ground voltage GND, and is fixed at an L level as a result. More specifically, the difference between the comparison voltage Vcmp and the reference voltage Vref1 is enlarged in response to the enable signal EN at an H level. At this time, charge pumping circuit 11 is activated in response to the enable signal EN at an H level. In other words, when the substrate voltage VBB does not attain the prescribed level, charge pumping circuit generates a substrate voltage VBB.

When charge pumping circuit 11 starts its operation as such, the substrate voltage VBB begins to decrease as shown by a solid line in FIG. 2. When the substrate voltage VBB becomes lower than the threshold voltage VTHP, p channel MOS transistor 5 is again turned on. Accordingly, the comparison voltage Vcmp decreases while the reference voltage Vref1 is fixed at an L level, and therefore, the comparison voltage Vcmp will not immediately become lower than the reference voltage Vref1. When the substrate voltage VBB becomes sufficiently lower than the threshold voltage VTHP and the comparison voltage Vcmp becomes lower than the reference voltage Vref1 as a result, the enable signal /EN from differential amplifier 16 attains an H level. Thus, the enable signal EN from inverter 18 is deactivated, and n channel MOS transistor 17 is turned off. Therefore, charge pumping circuit 11 stops its operation.

When charge pumping circuit 11 stops its operation, the substrate voltage VBB begins to increase again. In the following operation, the above described operation is repeated.

Since the substrate voltage detecting circuit according to the first embodiment includes differential amplifier 16 having a high gain as described above, the enable signal EN is activated in quick response to increase in the comparison voltage Vcmp. More specifically, response time Tinv from the time when the substrate voltage VBB becomes higher than the threshold voltage VTHP until the enable signal EN is activated is reduced as compared with the conventional response time Tcom described above. As a result, the responsibility of the internal voltage detecting circuit is improved, so that charge pumping circuit 11 can retain the substrate voltage VBB more stably.

Furthermore, the enable signal EN is fed back to the gate of n channel MOS transistor 17, and therefore, the difference between the comparison voltage Vcmp and the reference voltage Vref1 is enlarged when the comparison voltage Vcmp exceeds the reference voltage Vref1. Consequently, the substrate voltage VBB will not vary frequently around the threshold voltage VTHP.

In addition, since the internal voltage detecting circuit includes n channel MOS transistors 15, 19 to 22 each functioning as a constant current source, transistor 21 reduces current for driving differential amplifier 16 and transistor 22 reduces current for driving inverter 18, for example. As a result, current consumption of the entire substrate voltage detecting circuit is reduced. Thus, the responsibility of inverter 18 is degraded when the driving current for inverter 18 is reduced, but the responsibility of the entire substrate voltage detecting circuit will not be degraded since the substrate voltage detecting circuit includes differential amplifier 16 as described above.

[Second Embodiment]

Figure 3:
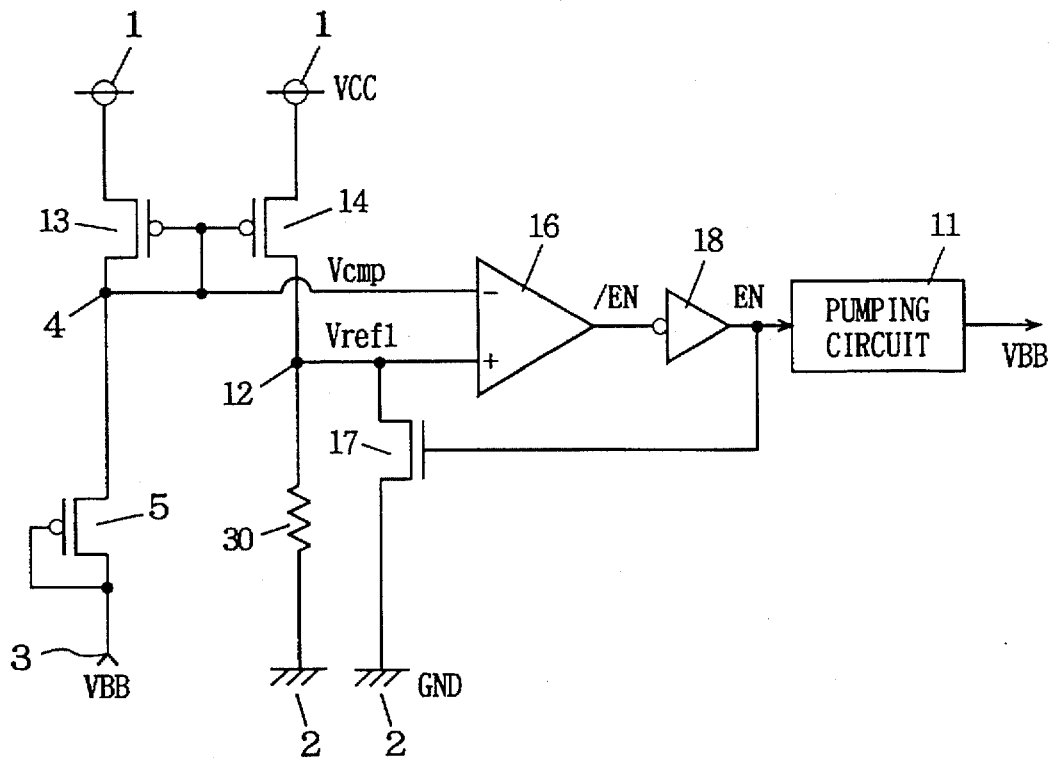
FIGS. 3 to 7 are circuit diagrams showing structures of substrate voltage detecting circuits according to second to sixth embodiments of the present invention, respectively.

Referring to FIG. 3, a substrate voltage detecting circuit according to a second embodiment of the present invention includes a resistance element 30 instead of n channel MOS transistor 15 such as shown in FIG. 1A, and does not include n channel MOS transistors 19 to 22 such as shown in FIG. 1A. Resistance element 30 is connected to a reference node 12, and supplies prescribed current to an n channel MOS transistor 14.

The substrate voltage detecting circuit operates in a manner similar to that of the first embodiment except the driving current reducing operation by n channel MOS transistors 19 to 22. Although it is desirable that n channel MOS transistors 19 to 22 in FIG. 1A are provided, they do not necessarily need to be provided as can be seen from the second embodiment.

[Third Embodiment]

Figure 4:
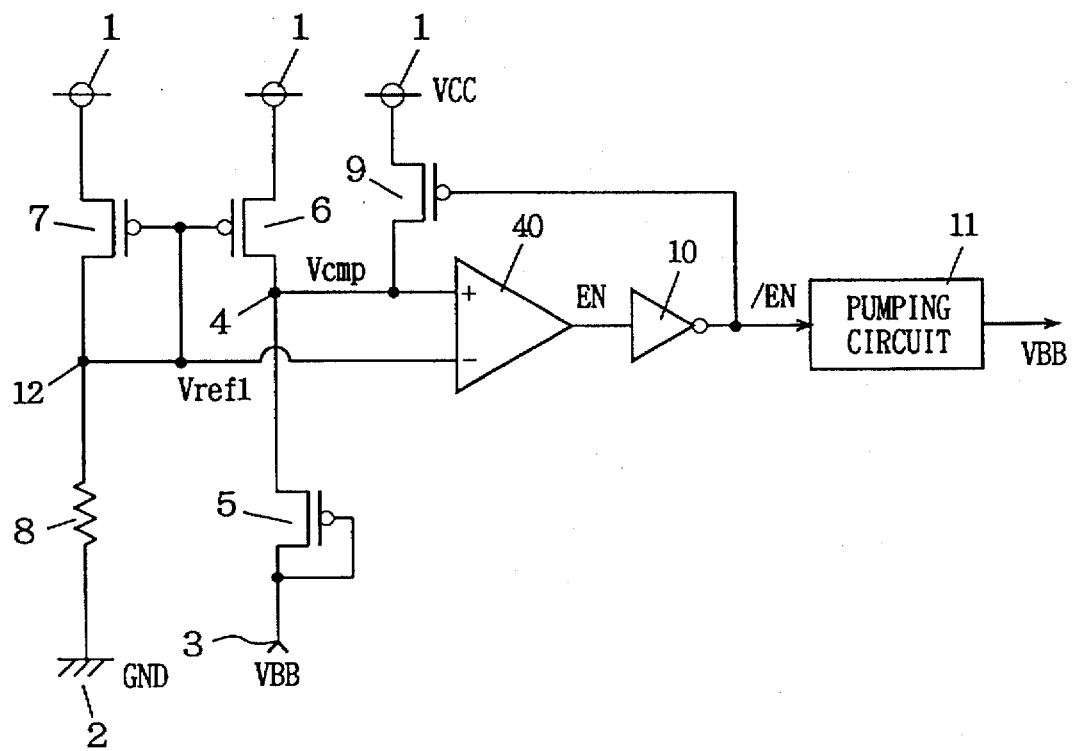

Referring to FIG. 4, in a substrate voltage detecting circuit according to a third embodiment of the present invention, a current mirror circuit is opposite in structure to that shown in FIG. 3. More specifically, a diode-connected p channel MOS transistor 7 is connected between a power supply node 1 and a reference node 12, and a resistance element 8 is connected between reference node 12 and a ground node 2. A p channel MOS transistor 6 is connected between power supply node 1 and a comparison node 4. Therefore, p channel MOS transistor 7 and resistance element 8 function as a constant voltage source which produces a reference voltage Vref1. Since p channel MOS transistor 6 receives the reference voltage Vref1 at its gate, it functions as a constant current source.

Furthermore, in the substrate voltage detecting circuit, input nodes of a differential amplifier 40 are opposite in position to those of the differential amplifier shown in FIGS. 1A and B or FIG. 3. More specifically, the reference voltage Vref1 is applied to the input node (−) thereof, and a comparison voltage Vcmp is applied to the input node (+) thereof. Accordingly, enable signals EN and /EN from differential amplifier 40 and an inverter 10 are opposite in logic to those in FIGS. 1A or 3, respectively.

In addition, in the substrate voltage detecting circuit, a p channel MOS transistor 9 turned on in response to the enable signal /EN from inverter 10 is connected between power supply node 1 and comparison node 4 instead of n channel MOS transistor 17 in FIG. 1A or 3.

The operation of the substrate voltage detecting circuit structured as such will now be described.

First, when the substrate voltage VBB is lower than a threshold voltage VTHP of a p channel MOS transistor 5, the comparison voltage Vcmp becomes lower than the reference voltage Vref1, and differential amplifier 40 therefore supplies an enable signal EN at an L level. Accordingly, inverter 10 supplies an enable signal /EN at an H level, and a charge pumping circuit 11 therefore do not operate. At this time, p channel MOS transistor 9 is turned off.

Then, when the substrate voltage VBB increases to be higher than the threshold voltage VTHP of p channel MOS transistor 5, p channel MOS transistor 5 is turned off, and the comparison voltage Vcmp therefore becomes higher than the reference voltage Vref1. Therefore, differential amplifier 40 supplies an enable signal EN at an H level. Accordingly, inverter 10 supplies an enable signal /EN at an L level, and charge pumping circuit 11 therefore stops its operation. At this time, since p channel MOS transistor 9 is turned on in response to the enable signal /EN at an L level, the voltage at comparison node 4 is fixed at an H level. In other words, the difference between the comparison voltage Vcmp and the reference voltage Vref1 is enlarged.

When the substrate voltage VBB is made sufficiently lower than the threshold voltage VTHP by charge pumping circuit 11, the comparison voltage Vcmp again becomes lower than the reference voltage Vref1. Accordingly, inverter 10 again supplies an enable signal /EN at an H level, and therefore, charge pumping circuit 11 stops its operation and the p channel MOS transistor 9 is turned off. In the following operation, the above described operation is repeated with increase in the substrate voltage VBB.

As described above, since the substrate voltage detecting circuit according to the third embodiment includes differential amplifier 40 as in the case of the embodiments 1 and 2, the responsibility thereof is improved. Furthermore, since the enable signal /EM is fed back to the gate of p channel MOS transistor 9, the substrate voltage VBB will not vary frequently around a prescribed level.

[Fourth Embodiment]

Figure 5:
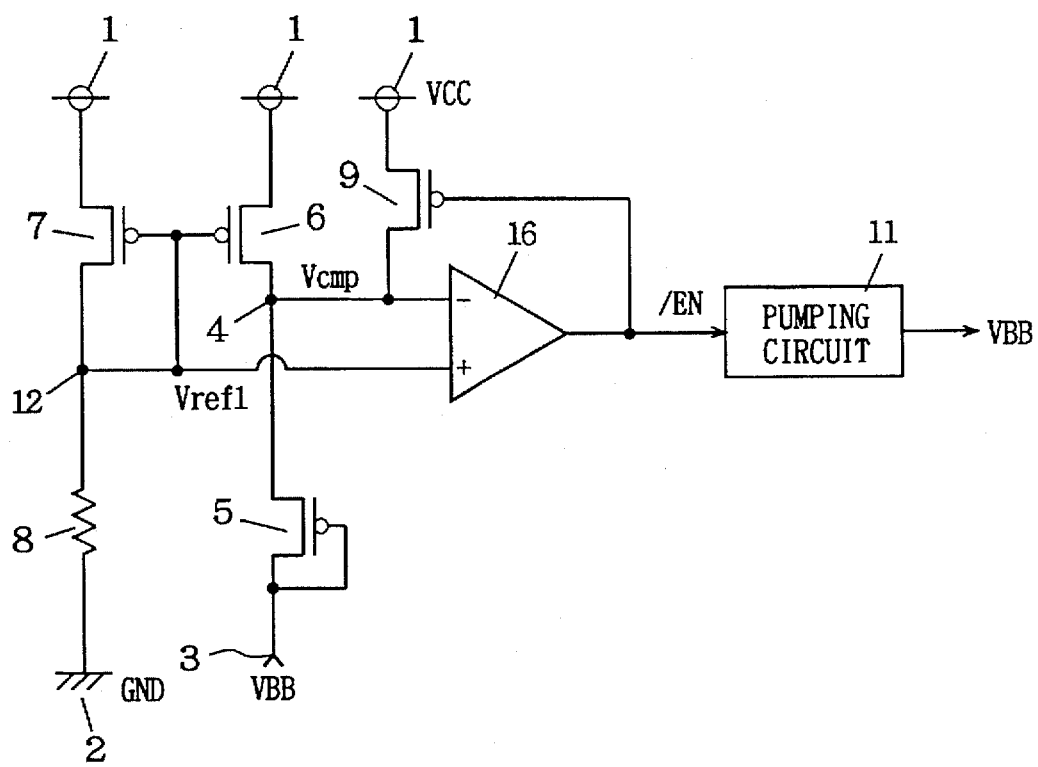

Referring to FIG. 5, in a substrate voltage detecting circuit according to a fourth embodiment of the present invention, input nodes of a differential amplifier 16 are opposite in position to those of the differential amplifier shown in FIG. 4. The substrate voltage detecting circuit includes no inverter 10 such as shown in FIG. 4.

When a substrate voltage VBB is lower than a threshold voltage VTHP, a comparison voltage Vcmp is lower than a reference voltage Vref1, and differential amplifier 16 therefore supplies an enable signal /EN at an H level. On the other hand, when the substrate voltage VBB is higher than the threshold voltage VTHP, the comparison voltage Vcmp is higher than the reference voltage Vref1, and differential amplifier 16 therefore supplies an enable signal /EN at an L level. Accordingly, the substrate voltage detecting circuit operates in a manner similar to that of the third embodiment.

As described above, inverter 10 such as shown in FIG. 4 does not necessarily need to be provided so long as the input nodes of differential amplifier 16 are opposite in position to those of the differential amplifier in FIG. 4.

[Fifth Embodiment]

Figure 6:
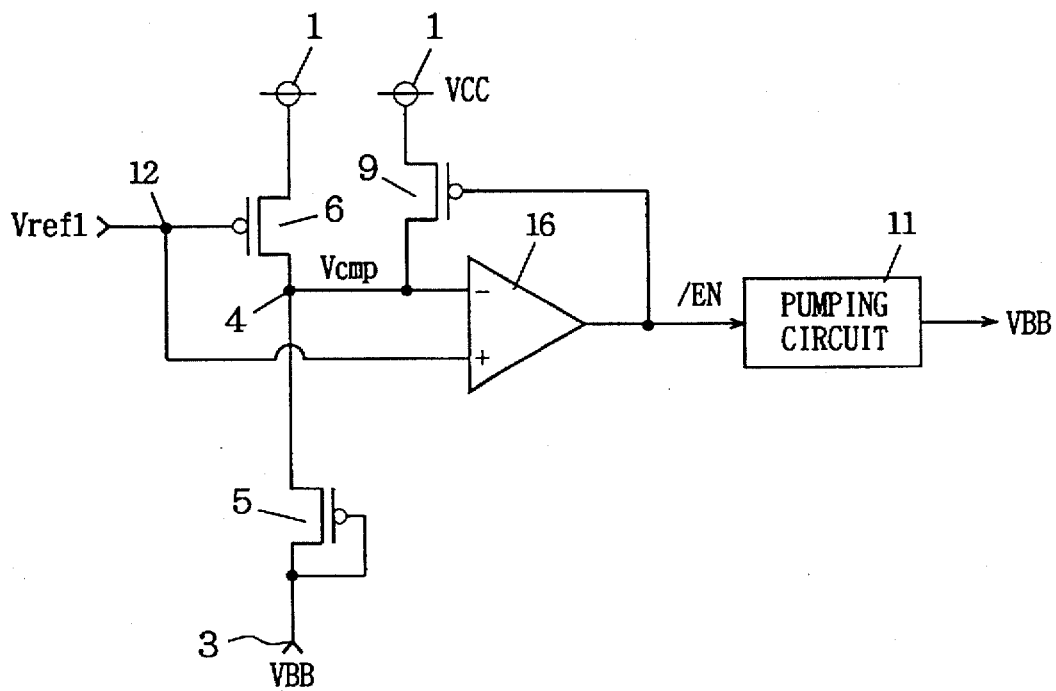

Referring to FIG. 6, in a substrate voltage detecting circuit according to a fifth embodiment of the present invention, a reference voltage Vref1 is supplied externally. Therefore, the substrate voltage detecting circuit includes no constant voltage source (7, 8) such as shown in FIG. 5 for internally generating a reference voltage Vref1. The substrate voltage detecting circuit operates in a manner similar to that of the fourth embodiment.

[Sixth Embodiment]

Figure 7:
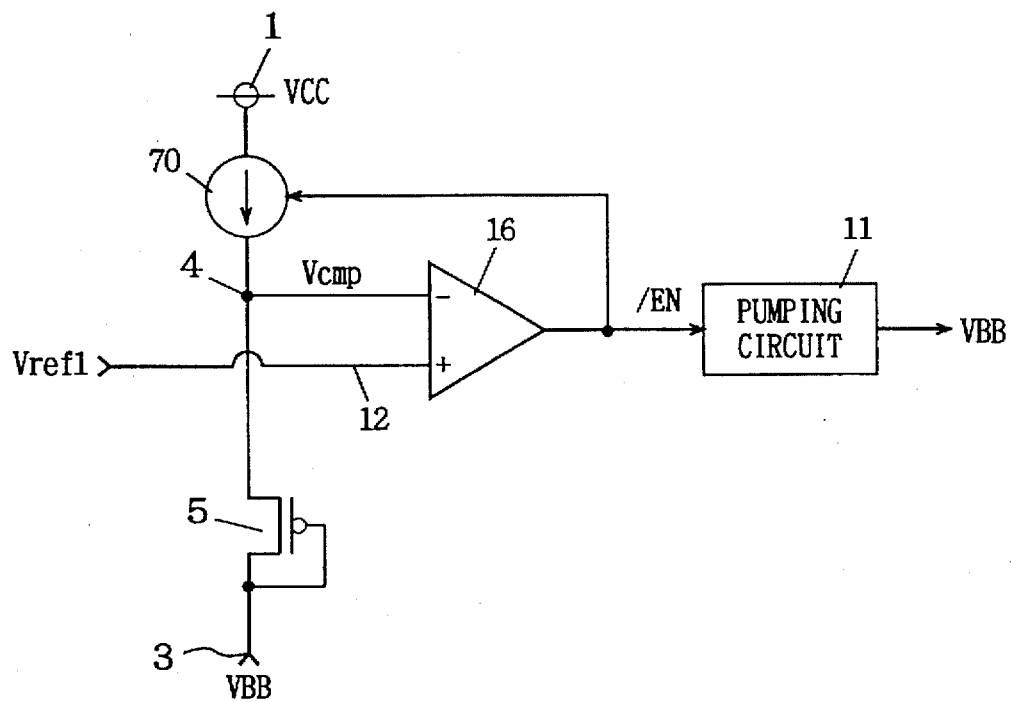
Figure 9:
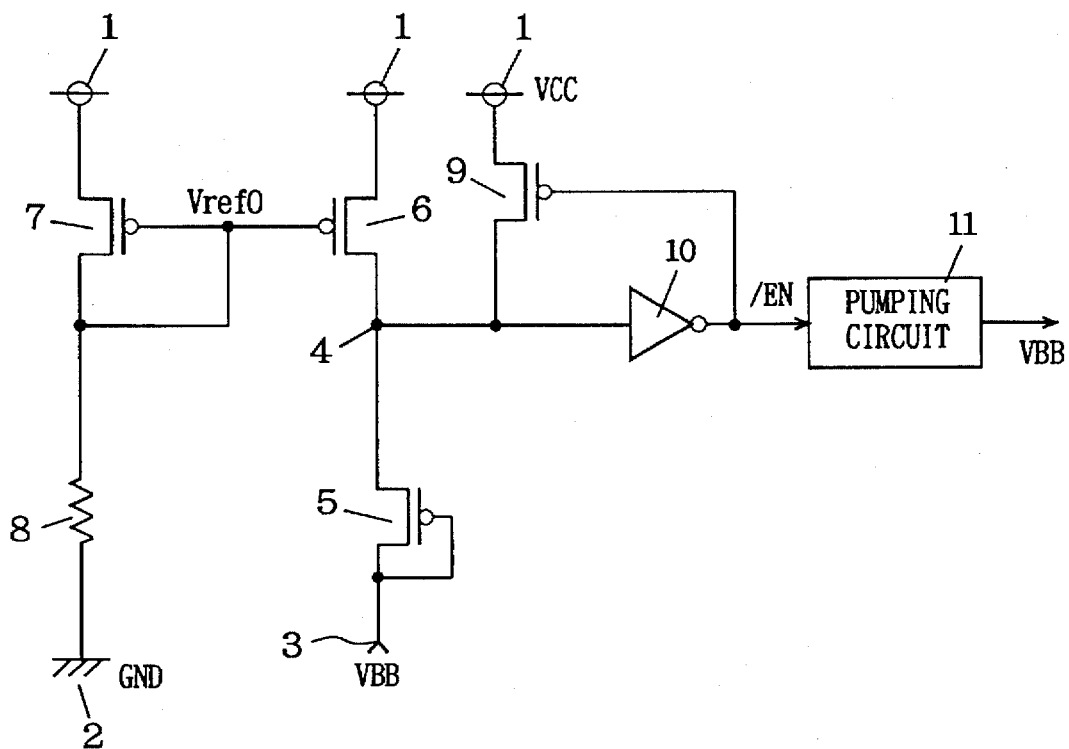
FIG. 9 is a circuit diagram showing a structure of a conventional substrate voltage detecting circuit.

Referring to FIG. 7, a substrate voltage detecting circuit according to a sixth embodiment of the present invention includes a current source 70 instead of n channel MOS transistors 6 and 9 such as shown in FIG. 6. Current source 70 reduces supply current when an enable signal /EN is at an H level, and increases supply current when the enable signal /EN is at an L level.

When a substrate voltage VBB is lower than a threshold voltage VTHP, the enable signal /EN is at an H level, and current source 70 therefore reduces supply current. When the substrate voltage VBB becomes higher than the threshold voltage VTHP, the enable signal /EN falls to an L level, and current source 70 therefore increases supply current, so that the difference between a comparison voltage Vcmp and a reference voltage Vref1 is enlarged. Accordingly, when the substrate voltage VBB again becomes lower than the threshold voltage VTHP, the comparison voltage Vcmp is immediately prevented from being lower than the reference voltage Vref1. Therefore, when the substrate voltage VBB is made sufficiently lower than the threshold voltage VTHP by a charge pumping circuit 11, the enable signal /EN attains an H level. Thus, charge pumping circuit 11 stops its operation, and current source 70 reduces supply current.

Current source 70 of the sixth embodiment performs not only a function of p channel MOS transistor 6 shown in FIG. 6 but also a function of p channel MOS transistor 9 in FIG. 6.

[Seventh Embodiment]

Although the embodiments of the substrate voltage detecting circuit has been described above, the present invention can be applied also to a boosted voltage detecting circuit for detecting an internal voltage other than a substrate voltage VBB, for example, detecting a boosted voltage VPP. In a DRAM, the boosted voltage is higher than a power supply voltage VCC, and is supplied to a word driver for driving a word line and a transistor for separating a bit line in a shared sense amplifier type, for example.

Figure 8:
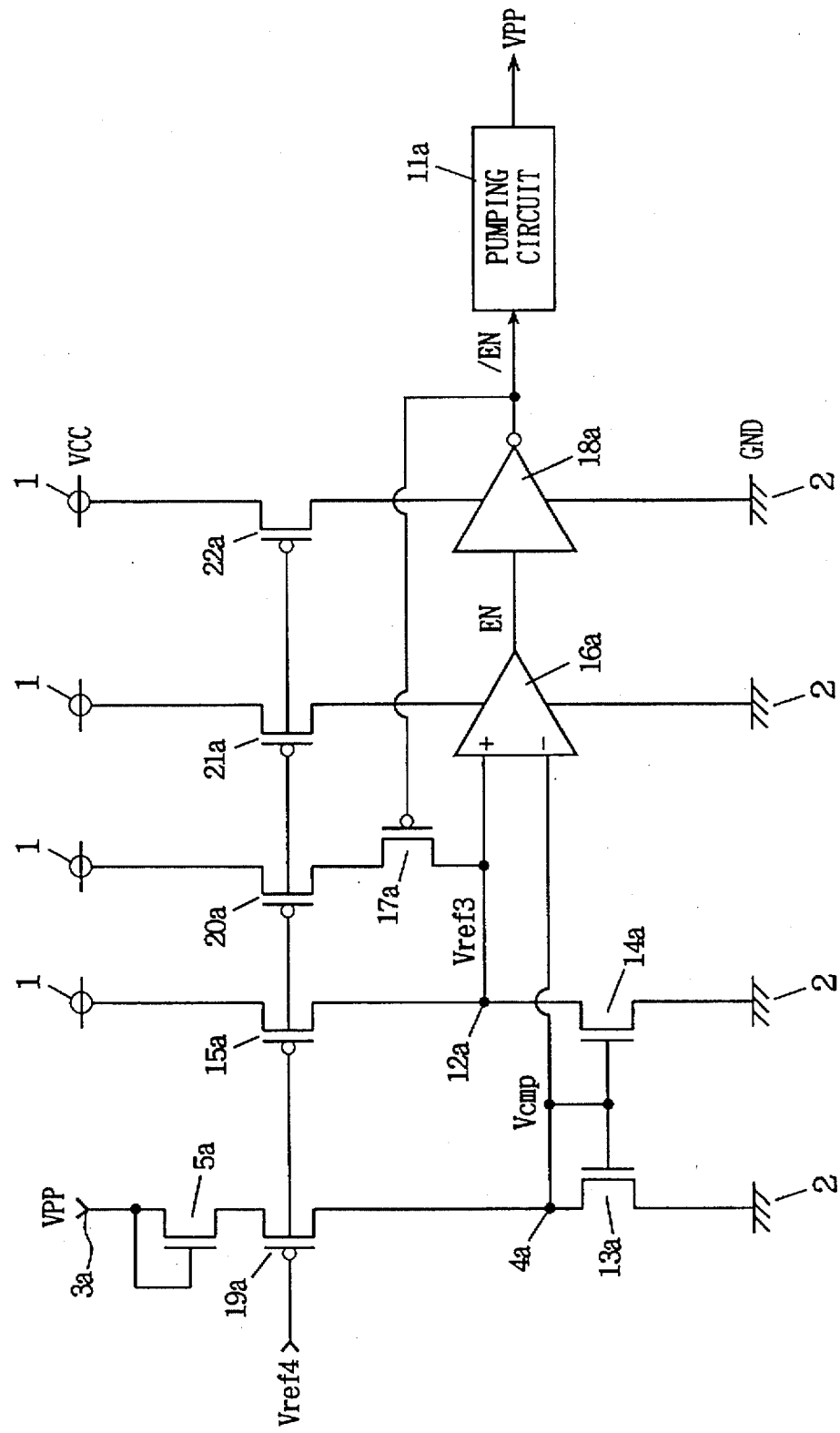
FIG. 8 is a circuit diagram showing a structure of a boosted voltage detecting circuit according to a seventh embodiment of the present invention.

Referring to FIG. 8, the boosted voltage detecting circuit according to a seventh embodiment is opposite in structure to the substrate voltage detecting circuit shown in FIG. 1A. More specifically, the boosted voltage detecting circuit detects a boosted voltage VPP, and activates, when the detected boosted voltage VPP does not attain a prescribed level, a charge pumping circuit 11a for generating a boosted voltage. The boosted voltage detecting circuit includes a detection node 3a receiving the boosted voltage, a reference node 12a where a prescribed reference voltage Vref3 is generated, a comparison node 4a where a comparison voltage Vcmp is generated, a diode-connected MOS transistor 5a connected between detection node 3a and comparison node 4a, a diode-connected n channel MOS transistor 13a connected between comparison node 4a and a ground node 2, an n channel MOS transistor 14a connected between reference node 12a and ground node 2 and having its gate connected to the gate of n channel MOS transistor 13a, a p channel MOS transistor 15a connected to reference node 12a for supplying prescribed current to n channel MOS transistor 14a, a differential amplifier 16a having an input node (−) connected to comparison node 4a and an input node (+) connected to reference node 12a for supplying, when the comparison voltage Vcmp is higher than the reference voltage Vref3, an enable signal EN for activating charge pumping circuit 11a, and a p channel MOS transistor 17a connected between reference node 12a and a power supply node 1 and turned on in response to an enable signal /EN.

The boosted voltage detecting circuit further includes p channel MOS transistors 19a to 22a for reducing current consumption. A reference voltage Vref4 is supplied in common to the gates of p channel MOS transistors 15a, 19a to 22a.

The boosted voltage detecting circuit structured as such operates in a manner similar to that of the first embodiment. More specifically, when the boosted voltage VPP is higher than a threshold voltage VTHN of n channel MOS transistor 5a, the comparison voltage Vcmp is higher than the reference voltage Vref3, and the enable signal /EN therefore attains an H level. On the other hand, when the boosted voltage VPP is lower than the threshold voltage VTHN, the comparison voltage Vcmp is lower than the reference voltage Vref3, and the enable signal /EN therefore falls to an L level. Accordingly, charge pumping circuit 11a operates, whereby the boosted voltage VPP increases. At this time, since p channel MOS transistor 17a is turned on, the reference voltage Vref3 is fixed at an H level. In other words, the difference between the comparison voltage Vcmp and the reference voltage Vref3 is enlarged.

As can be seen from the seventh embodiment, the present invention can be applied also to an internal voltage such as the boosted voltage VPP.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal voltage detecting circuit for detecting an internal voltage and activating, when the detected internal voltage does not attain a prescribed level, an internal voltage generating circuit for generating said internal voltage, comprising:

a detection node receiving said internal voltage;

a reference node where a prescribed reference voltage is generated;

a comparison node where a comparison voltage is generated;

changing means responsive to said internal voltage for changing said comparison voltage;

comparing means for comparing said comparison voltage with said reference voltage and outputting, when said comparison voltage exceeds said reference voltage, an activation signal for activating said internal voltage generating circuit; and enlarging means responsive to said activation signal for enlarging a difference between said comparison voltage and said reference voltage.

2. The internal voltage detecting circuit as recited in claim 1, wherein said comparing means includes a differential amplifier for outputting said activation signal when said comparison voltage is higher than said reference voltage.

3. The internal voltage detecting circuit as recited in claim 2, wherein said enlarging means includes a transistor connected between said reference node and a ground node and turned on in response to said activation signal.

4. The internal voltage detecting circuit as recited in claim 2, further comprising:

reducing means for reducing current for driving said differential amplifier.

5. The internal voltage detecting circuit as recited in claim 1, wherein said comparing means includes a first MOS transistor having its source connected to a power supply node, its drain and gate connected to each other, a second MOS transistor having its source connected to said power supply node, its drain outputting said activation signal and its gate connected to the gate of said first MOS transistor, a third MOS transistor having its source connected to a ground node, its drain connected to the drain of said first MOS transistor and its gate receiving said reference voltage, and a fourth MOS transistor having its source connected to said ground node, its drain connected to the drain of said second MOS transistor and its gate receiving said comparison voltage.

6. A substrate voltage detecting circuit for detecting a substrate voltage and activating, when the detected substrate voltage does not attain a prescribed level, a substrate voltage generating circuit for generating said substrate voltage, comprising:

a detection node receiving said substrate voltage;

a reference node where a prescribed reference voltage is generated;

a comparison node where a comparison voltage is generated;

a first diode-connected MOS transistor connected between said detection node and said comparison node;

a second diode-connected MOS transistor connected between said comparison node and a power supply node;

a third MOS transistor connected between said reference node and said power supply node and having its gate connected to a gate of said second MOS transistor;

current supplying means connected to said reference node for supplying prescribed current to said third MOS transistor;

a differential amplifier having a first input node connected to said comparison node and a second input node connected to said reference node, for outputting an activation signal for activating said substrate voltage generating circuit when said comparison voltage is higher than said reference voltage; and a fourth MOS transistor connected between said reference node and a ground node and turned on in response to said activation signal.

* * * * *